US007954017B2

(12) United States Patent
Kashyap et al.

(10) Patent No.: US 7,954,017 B2
(45) Date of Patent: May 31, 2011

(54) MULTIPLE EMBEDDED MEMORIES AND TESTING COMPONENTS FOR THE SAME

(75) Inventors: Amit Kashyap, Uttar Pradesh (IN); Prashant Dubey, Uttar Pradesh (IN); Akhil Garg, Uttar Pradesh (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 848 days.

(21) Appl. No.: 11/605,833

(22) Filed: Nov. 28, 2006

(65) Prior Publication Data
US 2007/0162793 A1 Jul. 12, 2007

(30) Foreign Application Priority Data
Nov. 29, 2005 (IN) .................... 3199/DEL/2005

(51) Int. Cl.
*G11C 29/00* (2006.01)
*G01R 31/28* (2006.01)
(52) U.S. Cl. ......... 714/718; 714/733; 714/724; 714/727
(58) Field of Classification Search .................. None
See application file for complete search history.

(56) References Cited

U.S. PATENT DOCUMENTS

| | | | | |
|---|---|---|---|---|
| 6,671,844 B1* | 12/2003 | Krech et al. | .................. | 714/736 |
| 6,988,230 B2* | 1/2006 | Vermeulen et al. | ............ | 714/727 |
| 2003/0009715 A1* | 1/2003 | Ricchetti et al. | .............. | 714/727 |
| 2005/0204230 A1* | 9/2005 | Nilson | ........................... | 714/727 |
| 2006/0107160 A1* | 5/2006 | Ricchetti et al. | ............... | 714/742 |
| 2007/0118782 A1* | 5/2007 | Whetsel | ........................ | 714/729 |
| 2007/0288815 A1* | 12/2007 | Whetsel | ........................ | 714/724 |
| 2008/0005633 A1* | 1/2008 | Whetsel | ........................ | 714/724 |
| 2009/0132881 A1* | 5/2009 | Whetsel | ........................ | 714/731 |

OTHER PUBLICATIONS

CAS-BUS: a Test Access Mechanism and a Toolbox Environment Core-based System Chip Testing.*
On IEEE P1500's Standard for Embedded Core Test.*
Mitra, S. ; McCluskey, E.J. ; Makar, S. ; Design for testability and testing of IEEE 1149.1 TAP controller, Issue Date : 2002,VLSI Test Symposium, 2002. (VTS 2002). Proceedings 20th IEEE Print ISBN: 0-7695-1570-3 on p. 247.*

* cited by examiner

*Primary Examiner* — Robert Beausoliel
*Assistant Examiner* — Guerrier Merant
(74) *Attorney, Agent, or Firm* — Lisa K. Jorgenson; William A. Munck

(57) ABSTRACT

A method of sharing testing components for multiple embedded memories and the memory system incorporating the same. The memory system includes multiple test controllers, multiple interface devices, a main controller, and a serial interface. The main controller is used for initializing testing of each of the dissimilar memory groups using a serial interface and local test controllers. The memory system results in reduced routing congestion and faster testing of plurality of dissimilar memories.

20 Claims, 4 Drawing Sheets

MULTIPLE EMBEDDED MEMORIES AND TESTING COMPONENTS FOR THE SAME

CROSS-REFERENCE TO RELATED APPLICATIONS

The present application is related to Indian Patent Application No. 3199/Del/2005, filed Nov. 29, 2005, entitled "METHOD OF SHARING TESTING COMPONENTS FOR MULTIPLE EMBEDDED MEMORIES AND THE MEMORY SYSTEM INCORPORATING THE SAME". Indian Patent Application No. 3199/Del/2005 is assigned to the assignee of the present application and is hereby incorporated by reference into the present disclosure as if fully set forth herein. The present application hereby claims priority under 35 U.S.C. §119(a) to Indian Patent Application No. 3199/Del/2005.

TECHNICAL FIELD

The present disclosure relates to testing embedded memories and in particular to systems and methods for sharing testing components for multiple memory types.

BACKGROUND

Memories are critical to conventional Application-Specific Integrated Circuits (ASIC). As integrated circuit technology has advanced, the complexity and density of circuit devices formed within a single integrated circuit (IC) has increased dramatically. Consequently, several problems have arisen with regard to testing ICs. For example, while the conventional testing methodologies for a memory array within an IC may be relatively straight forward, ICs typically have far fewer I/O pins available to an external circuit tester than are required to adequately test the memory array.

A general solution to the above-described and other difficulties with external testing is to embed test circuitry within the IC itself. Such integrated testing facilities are frequently referred to as built-in self-test (BIST), array self-test (AST), or array built-in self-test (ABIST) circuits and will hereinafter be referred to generally as BIST circuits.

Although the integration of BIST circuits within ICs facilitates IC testing, a central concern associated with BIST circuits is the large amount of die size consumed by the BIST circuit and associated circuitry. This concern is magnified as the number of memory arrays and other subcircuits integrated within an IC that require BIST testing multiply. This concern is particularly significant for state-of-the-art integrated circuits, such as a microprocessors and Application-Specific Integrated Circuits (ASICs), which commonly contain hundreds or thousands of relatively small memory arrays each requiring BIST testing.

One conventional system uses a common controller which controls the test activities on the entire chip while supporting a broad range of memory types like single port, dual port, register files and ROM. This is possible only due to a proper partitioning of the whole BIST system. However, the shared approach of this integrated circuit has a lot of parallel connections and hence occupies a lot of area due to routing congestion.

The concept of BIST is used for at-speeds equivalent to its application speed. Having a controller per BIST to run the desired algorithm as well as manage the repair activities will result in increased area and hence an increase in overall testing cost. Also more efforts will be needed at the time of chip integration. Thus various state of the art solutions are being given to share the test and repair resources across the plethora of memories on the chip. But then due to improper partitioning of the whole structure, the ultimate implementation becomes cumbersome as well as routing congestion prone as well as less than at-speed.

In existing architectures, the controller is embedded inside the BIST which controls the test activities. As the algorithm for testing single and dual port memories are different, the controller inside the BIST is hard coded for the desired algorithm. Thus, the controller's architecture changes from one memory type to other. As these controllers are replicated, for all the memories it results in lot of silicon area.

FIG. 1 depicts a conventional shared BIST architecture. In this architecture, a common controller interacts with only the tester. The different memory groups each have their own different controllers or have dedicated collars for the algorithm. In the latter case, all the memories are connected in parallel which increases the routing congestion and thus makes the BIST architecture highly floor plan dependent.

Accordingly, conventional systems and methods occupy a lot of area and experience routing congestion due to the various parallel connections between the memories. Conventional approaches make the BIST highly floorplan dependent and thus limit sharing memories which are physically close to each other. In addition, memories of different clock domain cannot be shared. For smaller conventional memories with large word widths, the gains are relatively small because the collar area cannot be reduced. Accordingly, gains cannot be shared between various memories nor can different types of memories be shared.

At-speed testing is not easily possible using conventional systems and methods. Either significant areas are wasted to achieve the at-speed testing or at-speed testing is simply not possible. Moreover, integration is a big issue for the user as the BIST area and performance becomes chip floor plan dependant. As more parallel lines are running for long distances, BIST defects can itself lower the yield of the chip. Conventionally shared BIST methodology is not easily programmable or even if programmability was possible, a lot of area is wasted.

Accordingly, there is a need for a common controller to control the test activities on the entire chip while supporting a broad range of memory types like single port, dual port, register files and ROM.

SUMMARY

The present disclosure provides a memory system and a method of sharing test components for multiple embedded memories.

In one embodiment, the present disclosure provides a memory system. The memory system includes dissimilar memory groups each having at least one memory type and local test controllers each coupled to at least one of said memory types to generate a control signal. The memory system also includes interface devices coupled to one of said dissimilar memory group to receive said control signals and a main controller to randomly initialize one of said local test controllers to test each of said dissimilar memory groups. The memory system further includes a serial interface connecting said local test controllers and main controller in a ring configuration for said random initialization.

In another embodiment, the present disclosure provides a method for testing multiple memories embedded in a chip. The method includes partitioning said multiple memories in said shared memory test architecture into a plurality of dissimilar memory groups and initializing a plurality of local test controllers associated with one of said dissimilar memory groups by a main controller. The method also includes testing memories using initialized local test controllers and generating a control signal associated with said initialized local test controllers for the main controller on completion of said testing. In addition, the method also includes repeating said initializing, said testing and said generating for each of said plurality of dissimilar memory groups and transferring a status of said plurality of dissimilar memory groups to the main controller.

In still another embodiment, the present disclosure provides a built-in self test system for reduced routing congestion for dissimilar memories each having at least one memory type. The system includes local test controllers each coupled to at least one of said memory types to generate a control signal and interface devices coupled to one of said dissimilar memory group to receive said control signals. The system also includes a main controller to randomly initialize one of said local test controllers to test each of said dissimilar memory groups and a serial interface connecting said local test controllers and main controller in a ring configuration for said random initialization.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

The present disclosure relates to a memory system which provides Floorplan Independent Built-In Self Test for Multiple Embedded Memories (FITSMEM), using shared test components.

According to one embodiment of the present disclosure, a common controller on the chip controls the test activities of all the memories. The present disclosure partitions the existing memory Built-In Self Test (BIST) architecture by separating out the at-speed memory. Size dependent parts like Address generator, Data Generator, Comparator and Control FSM are kept near the memory. These size dependent parts are combined to form a configurable collar in which the algorithms are programmable, thus reducing the collar size drastically.

On the other hand, information that is not memory size dependant and that need to be applied at a slower speed such as, for example, an algorithm march element, a stress pattern, a direction of the march element and a number of the operation in the march element, are kept at a central place and programmed each time through a serial interface.

Figure 1:
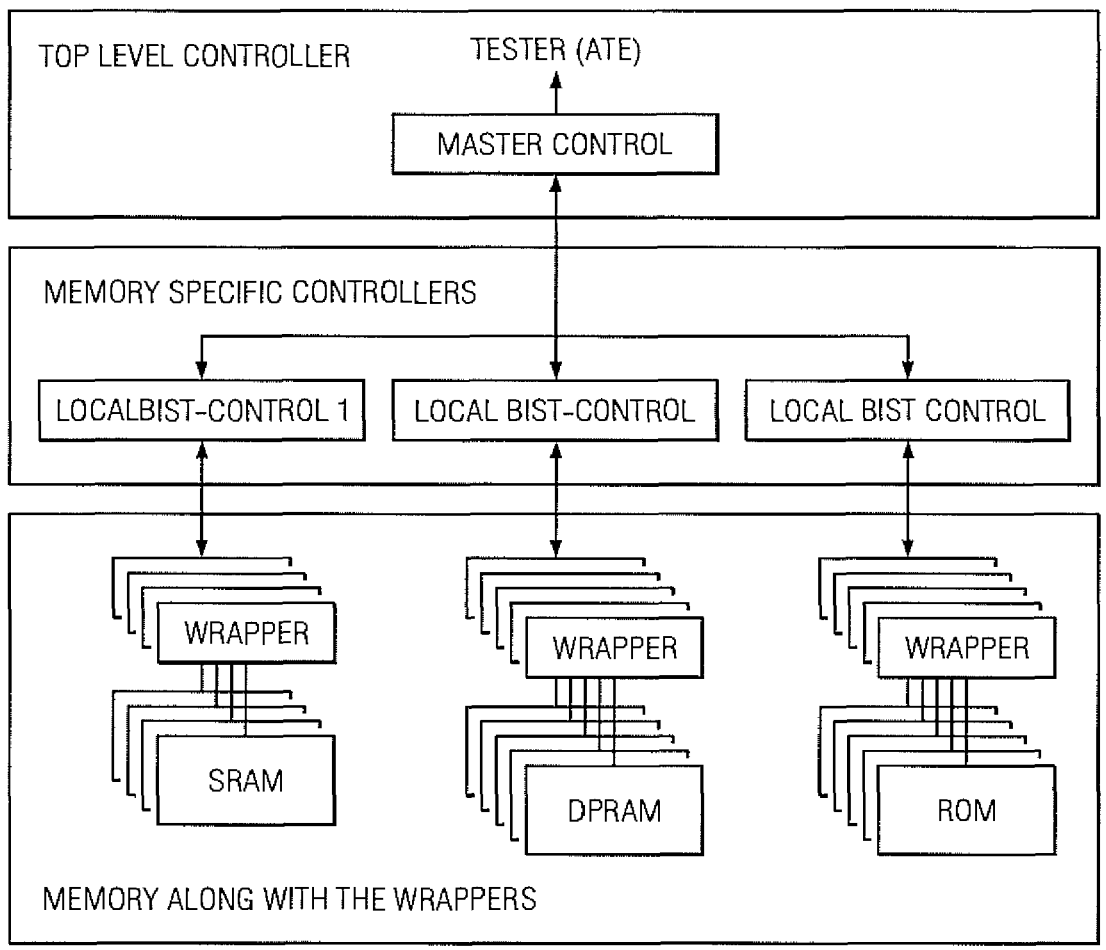
FIG. 1 is a block diagram of a conventional shared BIST architecture.
Figure 2:
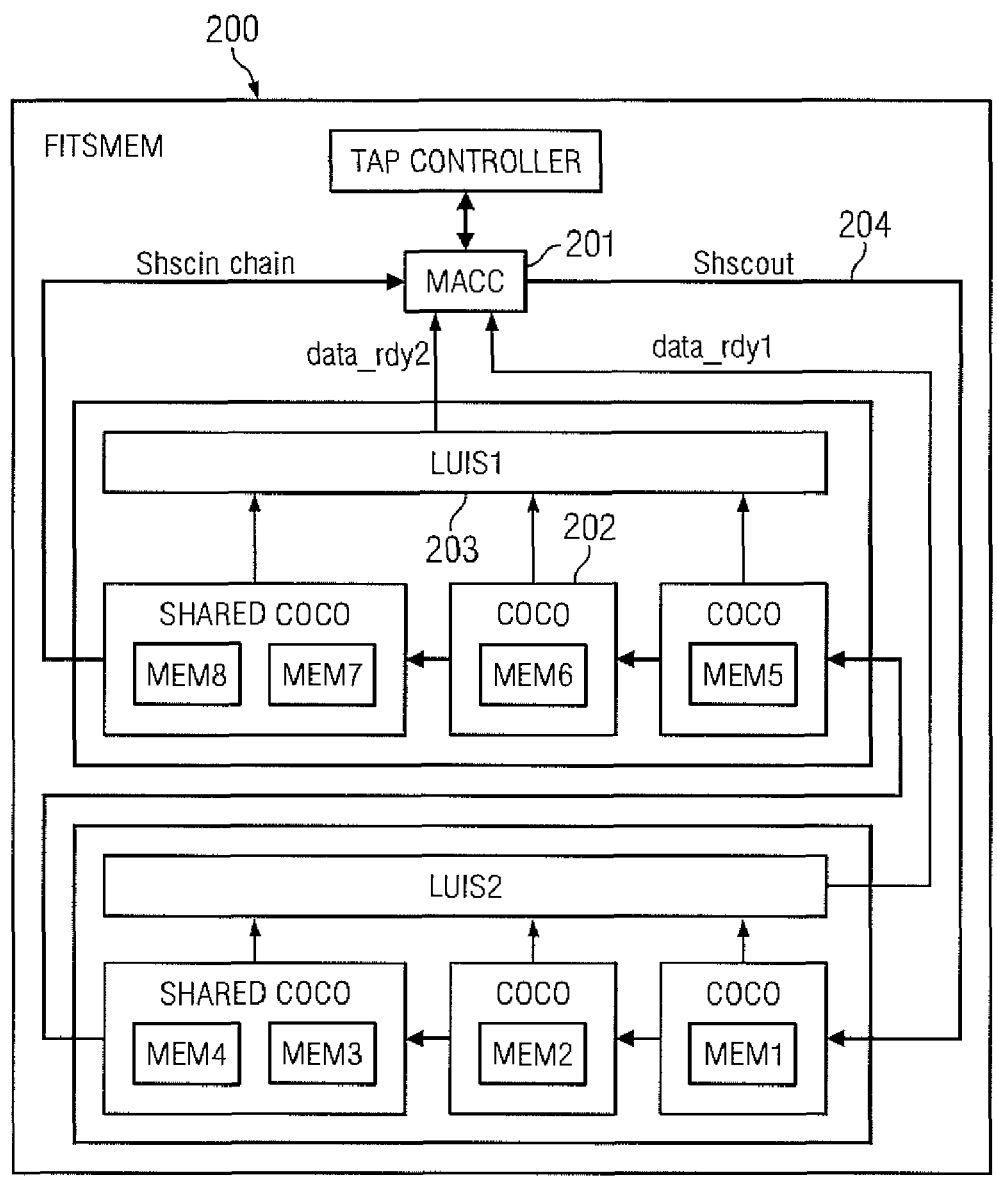
FIG. 2 illustrates a memory system according to one embodiment of the present disclosure.

FIG. 2 is a diagram for a memory system 200 showing the connection between the major components of said architecture (i.e., main controller or MACC 201, local controller or COCO 202 and interface device or LUIS 203) on a chip according to one embodiment of the present disclosure. The memories which need testing are coupled with the corresponding COCO. The COCOs are inter-connected serially in the form of a chain 204 across the chip. According to one embodiment of the present disclosure, a COCO may be shared among memories of the same size to further reduce the area. Moreover, the present disclosure allows the serial interface of COCOs of memories that are of the same type but may be made of different sizes to be shared, to reduce the area further. However, there may be a trade off with respect to routing congestion.

Figure 3:
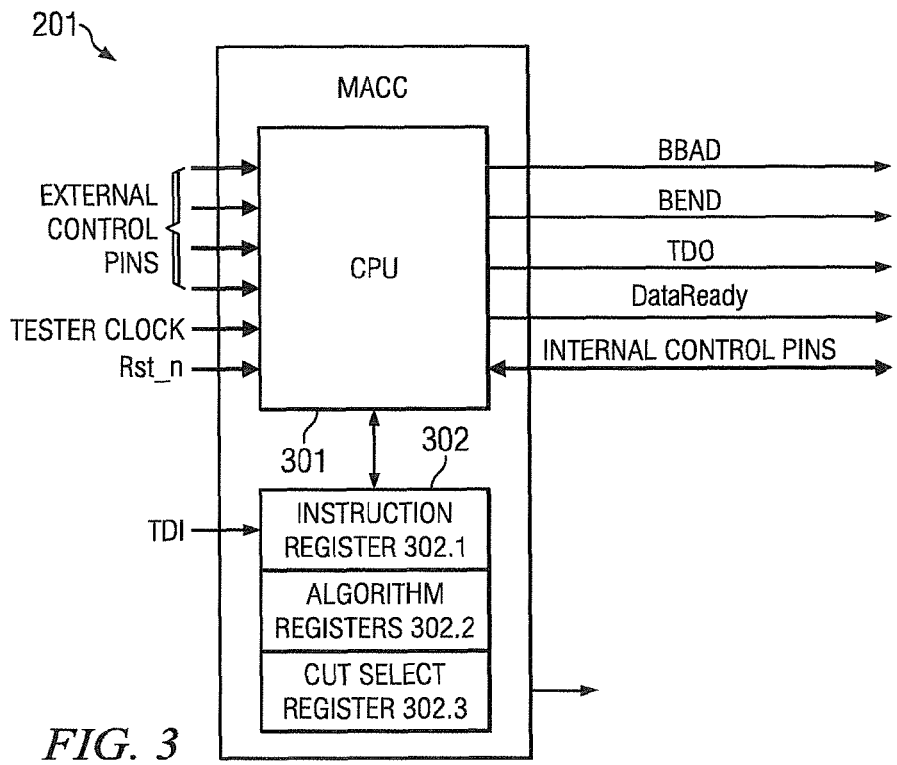
FIG. 3 is a block diagram of the main controller of said memory system according to one embodiment of the present disclosure.

FIG. 3 is a block diagram of the main controller (MACC) 201 of a memory system according to one embodiment of the present disclosure. The main controller includes a central processing unit 301 that handles all the memories on the chip. The main controller 201 also includes a plurality of registers blocks 302 having instruction register 302.1, algorithm register 302.2 and cut select register 302.3. The central processing unit 301 generates a set of control signals for the other components of the shared architecture responsive to the external control pins, tester clock and request in signal Rst_n. Cut selection, algorithm selection, algorithm configurations are performed by programming the MACC 201. The MACC 201 applies a particular selected algorithm, on the selected cuts on the chip. These features augment the capability of the MACC 201 as a diagnostic mechanism as well as enables a power conscious test circuit.

Figure 4:
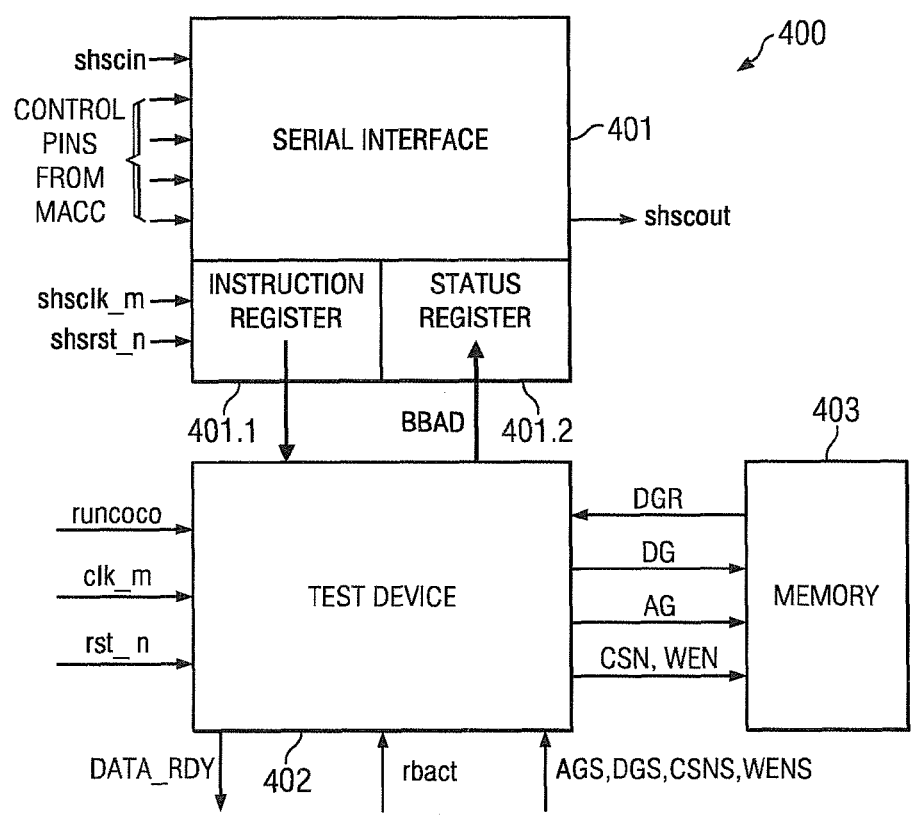
FIG. 4 is a block diagram of the local test controller of said memory system according to one embodiment of the present disclosure.

FIG. 4 shows a block diagram of the local test controller 400 of a memory system according to one embodiment of the present disclosure. The two main components of the local test controller are the serial interface block (401) and the test device or COCO collar (402).

Serial Interface block (401) includes main Registers like instruction register (401.1) and status register (401.2) which can be programmed by selecting the appropriate mode. The Serial Interface block (401) is working on shsclk_m, which is a low frequency clock. The serial interface block (401) receives the control signals from main controller 301 through the control pins and generates an output signal shscout.

Depending upon the March elements programmed in the instruction register (401.1) of the Serial Interface the COCO collar (402) performs the operation on the memory and after the end of March run generates the asynchronous data ready signal for the MACC to signify the end of operation. The test controller block generates a set of control signals for the memory (403). The COCO collar (402) is running at clk_m to support at speed testing as this is a high speed clock at which the memory will run during its application. Thus COCO collar (402) supports at speed testing of the memories.

Figure 5:
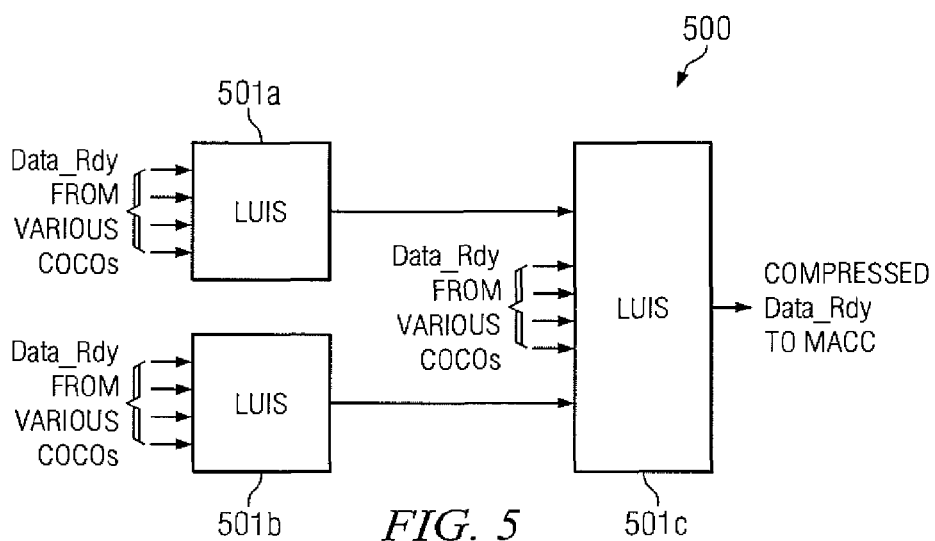
FIG. 5 illustrates a block diagram illustrating the arrangements of LUIS of said memory system according to one embodiment of the present disclosure.

FIG. 5 is a block diagram system 500 having an arrangement of LUIS 501a, 501b and 501c (collectively referred to herein as 501) of said memory system according to one embodiment of the present disclosure. The LUIS 501 or interface device acts as a handshake between the COCOs or test controller and the MACC or main controller. This handshake is implemented by giving out a dataready signal from each COCO. Thus, whenever a particular task is finished or a data is ready to be released by a COCO, the COCO sets a dataready flag to alert the MACC. The LUIS is provided to reduce the routing congestion arising from the large number of dataready pins. The LUIS monitors the dataready status of each memory and generates one data ready status for the MACC. The outputs of multiple LUIS may be fed to one LUIS to reduce the congestion further.

Generally, the memory system operates by programming the Cut Select Register in the MACC for those memories that require testing in a given run. Next, the system orders the Cuts in the Cut Select Register in the same order as the order in which the COCOs are connected in the serial interface or chain on the chip. The system then programs the Instruction register to select a particular Algorithm. When MACC goes in the run mode it programs the March elements of the selected algorithm in the serial interface of the COCO for memory testing.

While programming the Cut select register to Run the COCO of one memory type, the system bypasses COCO of the other types of memory. Next, the system bypasses the Serial Interface of the bypassed COCO by programming the corresponding bypass bit to '1' in order to bypass its serial chain. The FSM of these COCO collar will not run. After the MACC has gone into the Run mode, it waits for the data ready signal from the LUIS. Then, after receiving the data ready signal from the LUIS, the MACC goes in the capture mode to capture the good/bad status of the memory in the status register of the COCO serial Interface. This status can then be shifted out to decide which of the selected cut is good or bad. Once the algorithm is over the MACC signifies the end of operation using bend signal otherwise MACC again pings the COCO for the next march elements of the selected algorithm.

Figure 6:
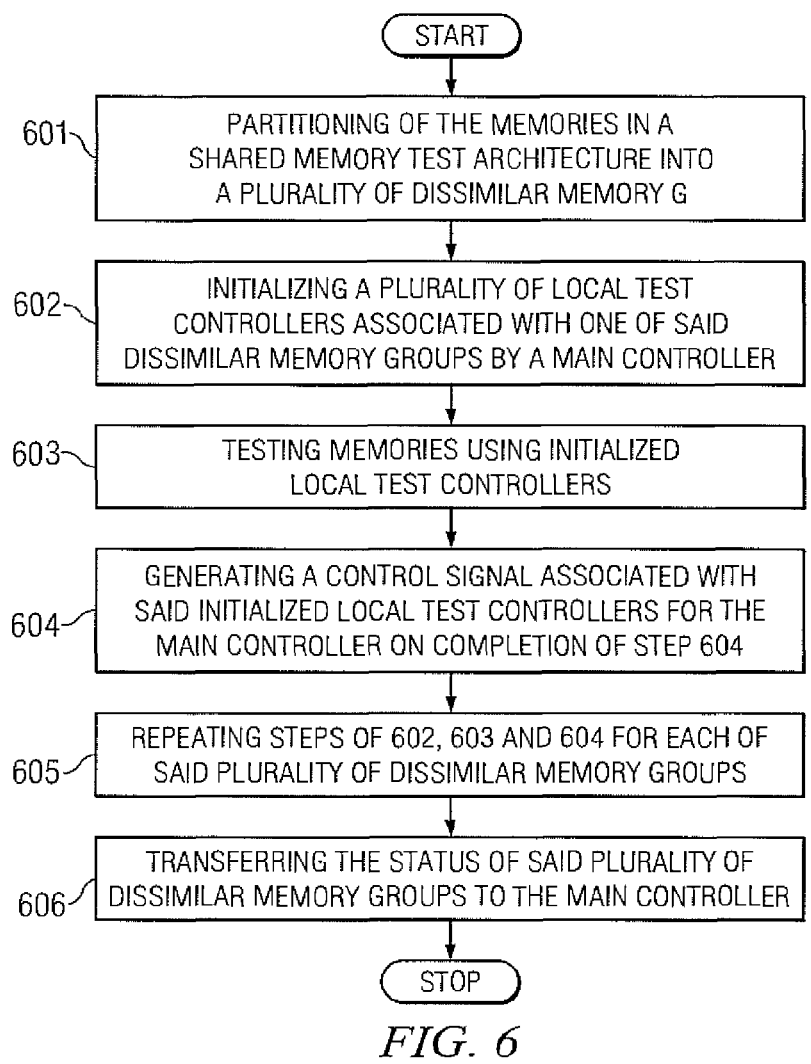
FIG. 6 illustrates a flow diagram of a method, according to one embodiment of the present disclosure.

FIG. 6 is a somewhat simplified flow diagram of a method according to one embodiment of the present disclosure. The multiple embedded memories are partitioned on the basis of speed, memory size, dependent parts, etc. in step 601 resulting in a plurality of dissimilar memory groups. In step 602 the main controller randomly initializes a plurality of local test controllers associated with one of the dissimilar memory groups. The initialized local test controllers are used for testing the associated memories in step 603. Each of said local test controllers associated with a dissimilar memory group generates a control signal on completion of testing. The plurality of control signals is combined to form a single control signal for the main controller in step 604. Steps 602 to 604 are repeated for each of said plurality of dissimilar memory groups in step 605. Finally, the status of the plurality of dissimilar memory groups is transferred to the main controller in step 606.

Accordingly, the present disclosure enables proper partitioning of the entire BIST system. The at-speed parts are kept near the memory, while the static or low speed parts are shared. This results in significant area saving, thus reduces the test cost. It is an objective of the present disclosure to provide a memory system having Built-In Self Test utilizing minimum area. It is also an object of the present disclosure to provide a memory system having an efficient subsystem for testing of memories. It is still another objective of the present disclosure to provide a memory system, with Built-In Self Test for any size of the memory and any number of memories. It is a further objective of the present disclosure to provide a memory system, with Built-In Self Test for multiple embedded memories (FITSMEM), which is floor plan independent.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A memory system comprising:
dissimilar memory groups each having at least one memory type;
local test controllers each coupled to at least one of said memory types and configured to generate a control signal;
interface devices coupled to one of said dissimilar memory groups and configured to receive said control signals;
a main controller configured to randomly initialize one of said local test controllers to test each of said dissimilar memory groups; and
a serial interface configured to connect said local test controllers and main controller in a ring configuration for said random initialization.

2. The memory system according to claim 1, wherein each said local test controllers comprises:
a serial interface block configured to operate on a first clock for said main controller; and
a test device connected to said serial interface block configured to operate on a second clock to test said memory type and configured to generate a control signal for the main controller.

3. The memory system according to claim 2, wherein said first clock is configured to have an operating frequency lower than an operating frequency of said second clock.

4. The memory system according to claim 1, wherein the main controller comprises:
a central processing unit configured to initialize test on all of said memories; and
a plurality of registers coupled to said central processing unit and operable to configure the testing of said memories.

5. The memory system according to claim 4, wherein the plurality of registers comprising:
an algorithm register operable to configure test algorithm for said main controller;
a cut select register operable to configure a selection of memories under test for said architecture; and
an instruction register configured to select instructions for algorithm in said algorithm register.

6. The memory system according to claim 1, wherein said plurality of interface devices comprises multiplexer devices configured to combine said control signals from plurality of said local test controllers associated with one of said dissimilar memory groups.

7. The memory system according to claim 1, wherein said memory types are categorized based on required memory test algorithm.

8. The memory system according to claim 1, wherein said memory types are categorized based on at least one of: speed, memory size, and dependent ports.

9. The memory system according to claim 1, wherein said memory system is floor plan independent.

10. A method for testing multiple memories embedded in a chip comprising:
   partitioning said multiple memories in said shared memory test architecture into a plurality of dissimilar memory groups;
   initializing a plurality of local test controllers associated with one of said dissimilar memory groups by a main controller;
   testing memories using initialized local test controllers;
   generating a control signal associated with said initialized local test controllers for the main controller on completion of said testing;
   repeating said initializing, said testing and said generating for each of said plurality of dissimilar memory groups; and
   transferring a status of said plurality of dissimilar memory groups to the main controller.

11. The method according to claim 10, wherein said generating a control signal further comprises:
   combining control signals generated by each of said localized test controllers.

12. The method according to claim 10, wherein said memories are partitioned by at least one of: speed, memory size, and dependent ports.

13. A built-in self test system for reduced routing congestion for dissimilar memories each having at least one memory type, said system comprising:
   local test controllers each coupled to at least one of said memory types and configured to generate a control signal;
   interface devices coupled to one of said dissimilar memory groups and configured to receive said control signals;
   a main controller configured to randomly initialize one of said local test controllers to test each of said dissimilar memory groups; and
   a serial interface configured to connect said local test controllers and main controller in a ring configuration for said random initialization.

14. The system according to claim 13, wherein each said local test controllers comprises:
   a serial interface block configured to operate on a first clock for said main controller; and
   a test device connected to said serial interface block configured to operate on a second clock to test said memory type and configured to generate a control signal for the main controller.

15. The system according to claim 14, wherein said first clock is configured to have an operating frequency lower than an operating frequency of said second clock.

16. The system according to claim 13, wherein the main controller comprises:
   a central processing unit configured to initialize test on all the memories; and
   a plurality of registers coupled to said central processing unit operable to configure the testing of said memories.

17. The system according to claim 16, wherein the plurality of registers comprising:
   an algorithm register operable to configure test algorithm for said main controller;
   a cut select register operable to configure selection of said memories under test for said architecture; and
   an instruction register configured to select instructions for algorithm in said algorithm register.

18. The system according to claim 13, wherein said plurality of interface devices comprises multiplexer devices configured to combine said control signals from plurality of said local test controllers associated with one of said dissimilar memory groups.

19. The system according to claim 13, wherein said memory types are categorized based on required memory test algorithm.

20. The system according to claim 13, wherein said memories are categorized by at least one of: speed, memory size, and dependent ports.

* * * * *

UNITED STATES PATENT AND TRADEMARK OFFICE
CERTIFICATE OF CORRECTION

| | | |
|---|---|---|
| PATENT NO. | : 7,954,017 B2 | Page 1 of 1 |
| APPLICATION NO. | : 11/605833 | |
| DATED | : May 31, 2011 | |
| INVENTOR(S) | : Kashyap et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 933 days.

Signed and Sealed this
Twenty-sixth Day of July, 2011

David J. Kappos
*Director of the United States Patent and Trademark Office*